United States Patent [19]

Neugebauer et al.

[11] Patent Number: 5,206,186

[45] Date of Patent: Apr. 27, 1993

[54] METHOD FOR FORMING SEMICONDUCTOR ELECTRICAL CONTACTS USING METAL FOIL AND THERMOCOMPRESSION BONDING

[75] Inventors: Constantine A. Neugebauer, Schenectady; Homer H. Glascock, II, Scotia; Kyung W. Paik, Clifton Park; James G. McMullen, Pattersonville, all of N.Y.

[73] Assignee: General Electric Company, Schenectady, N.Y.

[21] Appl. No.: 950,553

[22] Filed: Sep. 25, 1992

Related U.S. Application Data

[62] Division of Ser. No. 603,495, Oct. 26, 1990, Pat. No. 5,184,206.

[51] Int. Cl.⁵ .................. H01L 21/283; H01L 21/60; H01L 21/603
[52] U.S. Cl. ..................................... 437/183; 437/190; 437/192; 437/194; 437/197; 228/254
[58] Field of Search ............... 437/180, 183, 190, 192, 437/197, 198; 228/179, 254, 263.18, 263.19

[56] References Cited

U.S. PATENT DOCUMENTS

| | | | |
|---|---|---|---|
| 3,599,060 | 8/1971 | Triggs et al. | 357/71 |
| 3,840,982 | 10/1974 | Schuster et al. | 357/71 |
| 3,848,261 | 11/1974 | Romeo et al. | 357/71 |
| 4,263,606 | 4/1981 | Yorikane | 357/65 |
| 4,750,666 | 6/1988 | Neugebauer et al. | 228/160 |
| 4,907,734 | 3/1990 | Conru et al. | 228/179 |
| 5,118,370 | 6/1992 | Ozawa | 437/183 |
| 5,135,890 | 8/1982 | Temple et al. | 437/183 |

OTHER PUBLICATIONS

C. A. Neugebauer et al., "MCT Power Packaging", May 1990, Proceedings of the 40th IEEE ETCT, 2 pages.

Primary Examiner—Olik Chaudhuri
Assistant Examiner—David E. Graybill
Attorney, Agent, or Firm—Marvin Snyder

[57] ABSTRACT

Annealed copper foil (12) is coated with chromium film (16), followed by coating with an appropriate thickness of gold film (14) and is thermocompression bonded to an aluminum metallized substrate (18) on a silicon chip (30) to provide solderable, high current contacts to the chip. The foil is formed into appropriate electrical network-contact patterns (40) and is bonded to the silicon chip only where aluminum metallization exists on the chip. Leaf (wing) portions (46) of the foil extend beyond the boundaries of the silicon chip for subsequent retroflexing over the foil to provide electrical contact at predesignated locations (49). External contacts to the foil are made by penetrating through a ceramic lid positioned directly above the foil area. Thus, direct thermocompression bonding of a principally copper foil to aluminum semiconductor pads can replace current gold detent/bump connections by securing a copper conductor to a silicon chip through an intermetallic $AuAl_2$ link and an aluminum stratum.

7 Claims, 4 Drawing Sheets

METHOD FOR FORMING SEMICONDUCTOR ELECTRICAL CONTACTS USING METAL FOIL AND THERMOCOMPRESSION BONDING

This application is a division of application Ser. No. 07/603,495, filed 10/26/90 now U.S. Pat. No. 5,189,205.

RELATED APPLICATIONS

This application is related to application Ser. No. 07/375,569 filed on Jul. 3, 1989 now U.S. Pat. No. 5,028,987 and entitled: "High Current Hermetic Package Having a Lead Extending Through the Package Lid and a Packaged Semiconductor Chip" by C. A. Neugebauer et al. The 5,028,987 Patent, which is assigned to the instant assignee, is incorporated herein by reference and teaches a method for passing a thin foil connector through the top of a packaged semiconductor chip.

BACKGROUND OF THE INVENTION

1. Field of the Invention

This invention relates generally to electronic power device packagings of a thin and compact nature and, more specifically, to a method for providing substantially inductance-free electrical leads or connections for such devices in order to enhance the beneficial diminution of the physical parameters (i.e., weight, volume, resistance and inductance) of such devices and packagings.

The teaching herein is directly mainly to the realization of a singular device, but may be readily extrapolated to the batch fabrication of similar devices, such as integrated circuits.

2. Background Information

Previously disclosed lead or connector technology to avoid use of high inductance wires with electronic power chip devices employs what is termed "gold bump technology". A plurality of gold contacts are used within the aforementioned devices in the form of a plurality of metallic gold conductive detents on selected contact pads of the chip. This technology is practiced in accordance with the teachings of U.S. Pat. No. 4,750,666, issued to Neugebauer et al. and assigned to the instant assignee, which patent is incorporated herein by reference. In the patented invention, the gold detents (termed "bumps") are characterized as essentially semihemispherical dots of metallic gold that are bonded directly to certain aluminum contact pads of the device. Recently, two of the instant inventors have made known the result of studies which reveal the existence of certain anomalies present on a gold (Au) -aluminum (Al) interface of the type generally employing a gold detent-to-device pad contact, as aforementioned The identified aluminum, in the form of a stratum, results from the present practice of metallizing the semiconductor chip by applying, on desired chip surfaces, a thin layer of metallic aluminum. Under certain circumstances, there are formed at the intermetallic (Au-Al) zone of a gold-aluminum interface, several intermetallic compound phases comprising: $Au_4Al$, $Au_5Al_2$, $Au_2Al$, $AuAl$ and $AuAl_2$, the last compound termed "purple plague". This $Au_xAl_y$ formation, and accompanying Kirkendall void formation, is a problem known since 1975 in the aluminum bimetallic interconnection technology. A good deal of studies have now been performed in order to understand in detail the mechanism of the purple plague formation. Corrosion, induced by impurities such as bromides, fluorides and chlorides, at temperatures over 180° C., accelerates purple plague formation, resulting in premature bond failure at the Au-Al interface. To reduce bond failure caused by purple plague and void formation, stringent control of chlorine, bromine and fluorine is employed. The purple plague formation is explained by a metal-metal diffusion phenomenon and thus it is likely to be present in any gold-aluminum interfacing. The rate of formation of the final stable compound depends on the reaction temperature and the proportions of gold and aluminum in the initial binary (Au-Al) film. First interaction occurs during heat treatment at about 100° C. and produces an intermediate layer of $Au_2Al$, transitioning through a brief intermediate stage of $Au_5Al_2$ formation. This process dominates until all aluminum has been consumed. Should the thickness of the aluminum stratum be larger than that of the gold, heating at 230° C. converts low temperature-formed $Au_2Al$ to $AuAl_2$. Conversely, when the thickness of aluminum is smaller than that of the gold, the final phase will be a higher gold containing compound, such as $Au_4Al$, from the previous low-temperature $Au_2Al$. In all cases, the thickness of the developing compound layer is proportional to the square root of annealing time; this implies that all the interactions are diffusion-limited. In conventional gold wire bonding, there is always an excess of gold available (because some length of the gold wire must remain to provide a conductive path) and, where gold is always present in excess, the reaction continues, and purple plague formation may become critical. At normal operating conditions, the temperature of power chips should not exceed about 150° C. and, under pristine conditions, purple plague would not present a problem. However, should the temperature exceed 200° C. for long periods, or should halides of the aforementioned types be present, the chip contact will probably fail.

It may thus be seen that the multiple and varied intermetallic compound phasing, with accompanying Kirkendall void formation, presents a severe problem in gold-aluminum interconnection technology. The solution to this problem, as set forth herein, provides, quite unexpectedly, a way of further enhancing compact, thin-pack construction of semiconductor power devices.

SUMMARY OF THE INVENTION

The present invention overcomes the gold-aluminum intermetallic multiphasic problem known as purple plague. It is known that, at high temperatures, the reaction between gold and aluminum to form an intermetallic phase leads to bond degradation should the thickness of the intermetallic phases become too great. This phenomenon also obtains if the aluminum is depleted so much that the interface to the chip is no longer through a thin aluminum film, but rather the contact is to the intermetallic phase, directly. This limits the process of the gold bump technique (specifically for cases in which copper foil is attached thereby to the top aluminum metallization for the purpose of reduced lateral electrical resistance), to a temperature somewhere between 200°-300° C., depending on the level of halide impurities present. The instant invention eliminates reliance upon the gold bump technology through use of a novel, direct thermocompression-bonded foil connection technique.

Conceptually, the instant technique is devised for, but not limited to, copper connections which pass through a package lid to the semiconductor device as in a packaged power unit or module. The semiconductor device is described herein as an integrated circuit chip, although it may, alternatively, comprise a discrete power device. A silicon chip is provided with a base or bottom layer of chromium-nickel-silver and an upper or top substrate of aluminum which comprises the contact pads of the device. A thin, principally copper foil made according to the following specification is thermocompression bonded directly to an aluminum pad of a silicon chip. The copper foil is first coated with a chromium (Cr) film, and then a gold film, each of the order of several thousand angstroms thick. The copper foil thickness may vary from one to ten mils. The composite foil is etched or stamped into a desired shape which may contain voids or slots (lacy construction) in order to reduce thermoexpansion mismatch after bonding to a chip. Special marginal frame design is employed in order to form a plurality of leaves or wings in the foil laminate, with excess foil overhanging the physical chip boundaries after bonding thereto. To accomplish the bond, the foil is aligned over the top aluminum pad or pads (metallization) of the chip and thermocompressively bonded at about 325° C., for approximately one-half to one hour. For a copper foil coated with a gold film, this would normally result in conversion of the gold film on the copper foil into $Au_xAl_y$ intermetallic at the aluminum-foil interface. According to the instant invention, however, aluminum is deliberately supplied in excess, so as to not be consumed fully by the reaction, and all the gold is converted to the stable $AuAl_2$ phase. The remaining boundary layer of aluminum (metallization on the chip) prevents the intermetallic from directly contacting the silicon chip, while the earlier-deposited chromium film on the copper foil forms a barrier layer which prevents copper diffusion into the (remaining) aluminum film, thus avoiding formation of any aluminum-copper intermetallics and copper doping of the silicon while preserving good ohmic contact to the silicon.

After successful thermocompression bonding, the extra marginal leaf areas of the foil are bent or retroflexed over the chip margin, essentially superimposing them over the now-bonded foil portions from which they extend. The retroflexed leaves provide stress relief contact for through-the-lid connectors in all thin-pack applications. They may pass through the lid as leaf-like contacts (application Ser. No. 07/375,569, ibid.) or be used to contact copper spheres which reside in holes that are cut directly through the thin-pack ceramic lid. This latter technique is described in an article entitled "MCT Power Packaging" by C. A. Neugebauer et al., and reported in the Proceedings of the 40th IEEE ETCT, May, 1990.

BRIEF DESCRIPTION OF THE DRAWINGS

The features of the invention believed to be novel are set forth with particularity in the appended claims. The invention, itself, however, both as to organization and method of operation, together with further objects and advantages thereof, may best be understood by reference to the following description taken in conjunction with the accompanying drawings in which:

DETAILED DESCRIPTION OF THE PREFERRED EMBODIMENT

At high temperatures, the reaction between aluminum and gold laminate, to form an intermetallic phase between the separate lamina, varies in molecular composition according to temperature and the level of halide contamination. When aluminum and gold are used to form an electrical connection, for example on a silicon semiconductor chip, a gold contact layer tends to delaminate if the thickness of the intermetallic phase becomes too great or if the aluminum becomes so depleted that the gold interface with the chip no longer occurs through a thin aluminum film. The instant invention overcomes this problem and provides, for the first time, an inductance-free, permanently bonded contact for a semiconductor power device, the bond being capable of handling high density currents.

Figure 1:
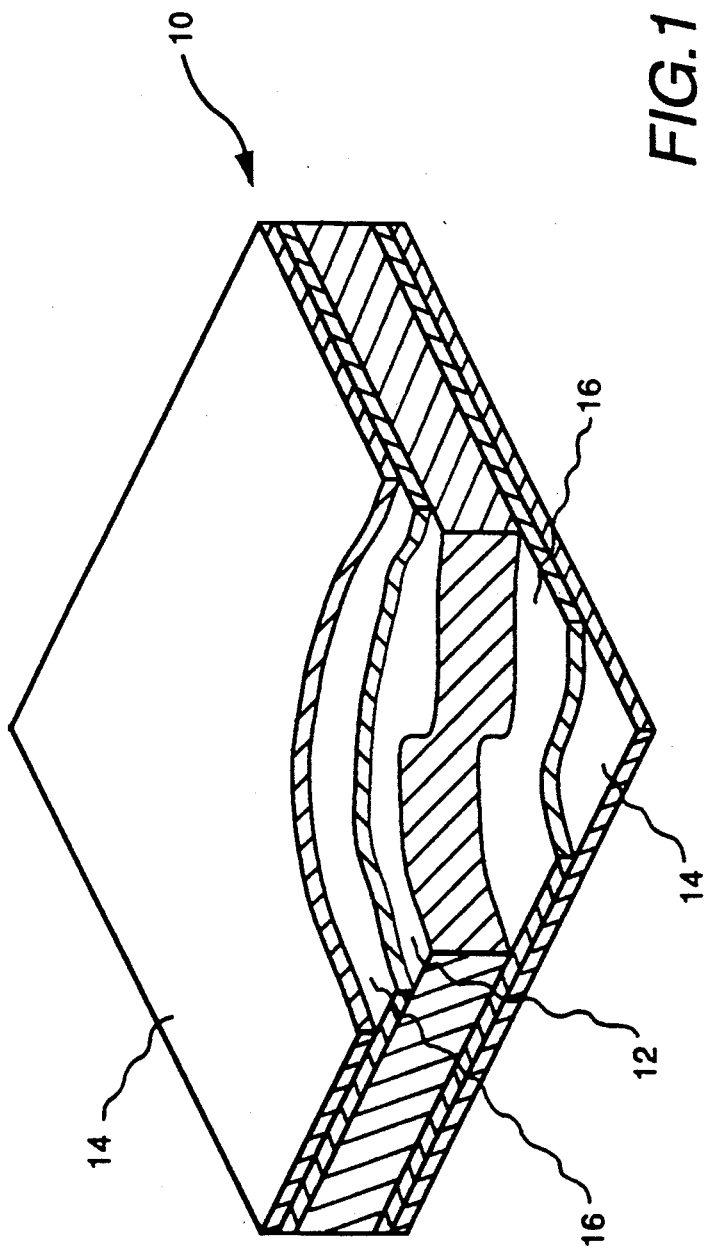
FIG. 1 is an isometric drawing of the multilaminate foil of the invention, shown partially cut away.

FIG. 1 illustrates, in isometric graphics, a cut away or "peeled-away" section of a foil conductor 10, in accordance with the invention. The planar conductor 10 comprises a base foil sheet of copper 12 sandwiched between outer laminae (or plies) of gold 14. For reasons which will become apparent hereinafter, laminae 16 of chromium are interposed between the copper lamina 12 and each of the gold laminae 14. As those of ordinary skill will readily infer, the essential composition of foil laminate 10 resides in the copper-chromium-gold stratification, the gold laminae literally taking the place of the gold bumps (not shown herein) of the earlier technology. To fabricate laminate 10, copper foil 12 is first sputter-coated or otherwise clad with metal films, first chromium, and then gold, each film being on the order of several thousand Angstroms thick. The copper foil thickness may vary from one to ten mils.

Figure 2:
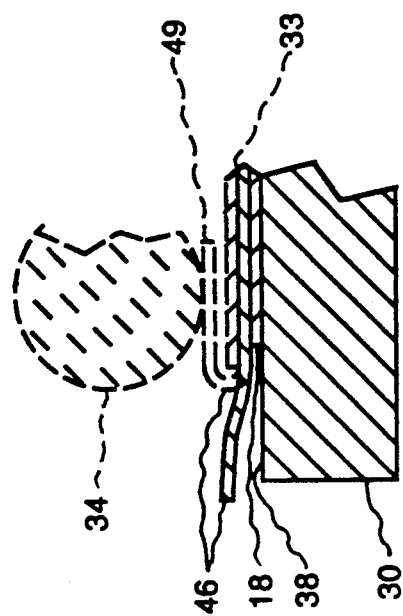
FIG. 2 is a cross sectional detail of the invention, showing foil bonded to a metallized chip at a portion of its package.

FIG. 2 presents a side elevation of the inventive conductor 10 as it would appear superimposed on a partially encapsulated semiconductor chip 30. Chip 30, which may be comprised of silicon, is metal coated at selected areas of its top surface with aluminum 18, which comprises the contact padding of the device. The bottom of silicon chip 30 is provided with a metallization layer 20 comprising a multiple metallic coating (e.g., gold on gold/silicon, aluminum on aluminum/silicon, or silver on nickel on chromium) to make it compatible with the cup or package base 32, which may be comprised of chromium-nickel-silver. Since the structure shown in FIG. 2 represents the already thermocompression-bonded article of the invention, the region denoted 17 is the gold-aluminum intermetallic stratum, consisting essentially of $AuAl_2$. A critical aspect of the invention has been embodied at this juncture, namely, that the gold lamina 14 which previously existed between intermetallic compound layer 17 and bottom chromium layer 16, has been completely consumed. At the same time, a lamina 18 of aluminum remains interposed between intermetallic lamina 17 and silicon chip 30. The weight of aluminum in the aluminum layer is greater than the $AuAl_2$ stoichiometric equivalent weight of gold in the intermetallic compound layer. During the coating of the gold-onchromium as aforementioned, a calculation must be made that is carefully based upon the known thickness of aluminized padding 18 on semiconductor device 30. This calculation is made to determine the precise thickness of gold coating which will assure that, upon formation of intermetallic lamina 17, the gold between intermetallic lamina 17 and bottom chromium layer 16 will be entirely consumed, placing the bottom chromium layer 16 in juxtaposition with intermetallic lamina 17. Concomitantly and by design, a thin lamina of aluminum 18 will remain interposed between intermetallic lamina 17 and silicon chip 30. This fabrication step is performed so that no gold will remain in a high gold phase of intermetallic gold-aluminum composition; instead, an aluminum boundary layer of barrier will exist between intermetallic lamina 17 and silicon 30 in order to prevent further reaction. Chromium lamina 16 between intermetallic lamina 17 and copper foil 12 provides a similar metallic boundary layer in order to assure that no copper-aluminum intermetallics will form.

Figure 3:
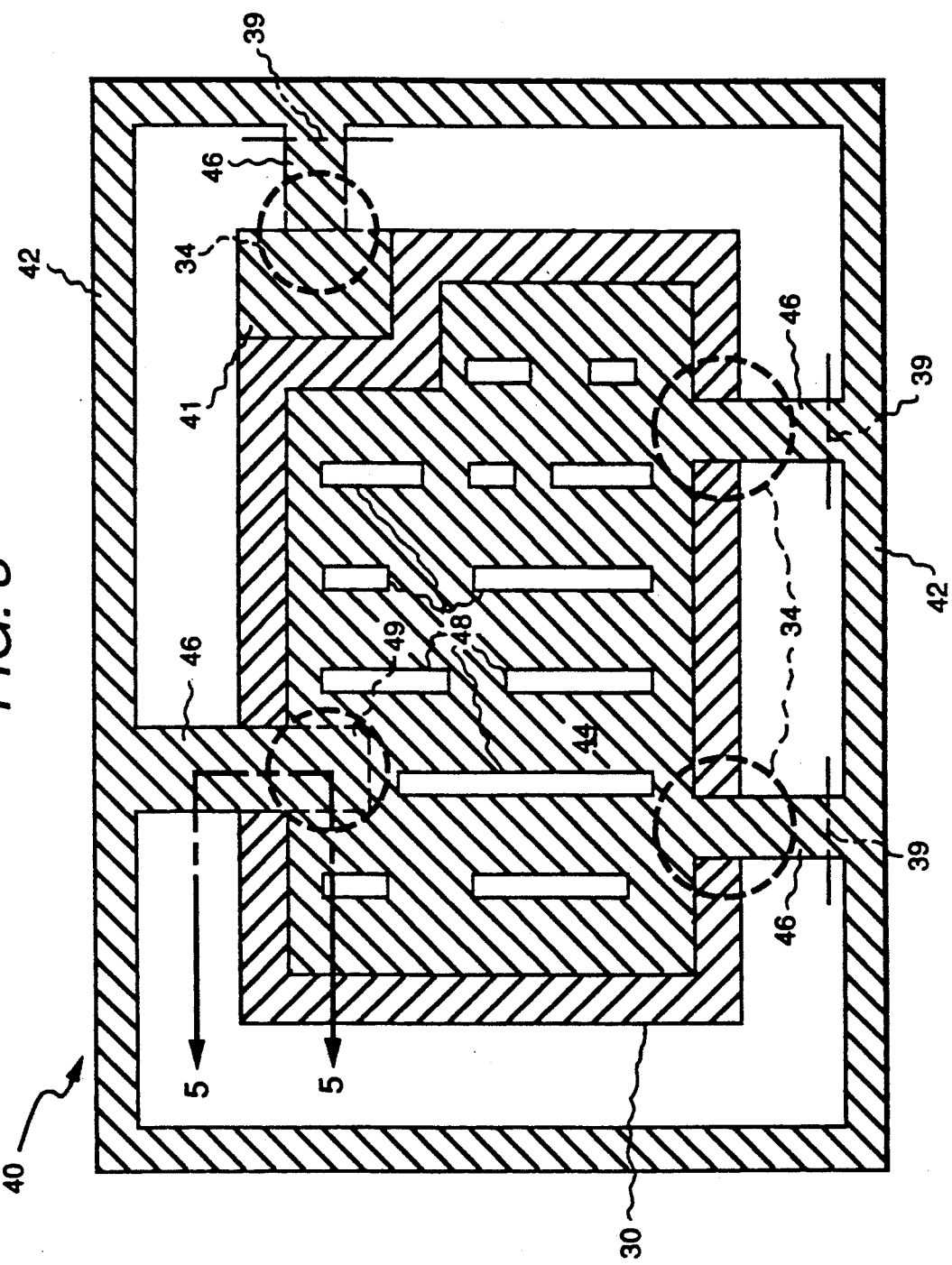
FIG. 3 is a top plan schematic of a semiconductor chip bearing thereover a foil network fabricated in accordance with the invention.

After conductor 10 has been fabricated using the desired thickness foil and calculated chromium and gold coatings (i.e., the gold being employed in quantity small enough to be totally exhausted in formation of intermetallic lamina 17), the copper foil is etched or stamped into the template shape 40 shown in FIG. 3. This general configuration comprises three discrete portions: a metallic frame 42, one or more contact zones, such as zones 41, 44 which are herein termed islands, and extension areas 46, hereinafter termed "wings" or "leaves". Leaves 46 are integral connectors between frame 42 and islands 41 and 44. In the template proper are various holes or apertures 48, particularly in major contact zones, which result in what is known as "lacy construction". As previously pointed out, foil 10 (FIGS. 1 and 2), particularly in the area representative of island 44, is to be bonded directly to aluminized padding 18 of the chip 30 surfaces, except on the periphery of chip 30, denoted a guard ring region 38. The purpose of the lacy construction is to reduce thermal expansion mismatch after the foil is bonded to the chip metallization. Not visible in FIG. 3 is the aluminized padding which is directly under island 44 of the foil. The minor island 41, comprising the gate of a typical MCT (MOS controlled thyristor), is illustrated in the upper right hand corner of device 30. It may be seen that at least one leaf 46 connects an island with frame 42, but the islands are separate and electrically isolated from one another. Cutting lines 39 are indicated in phantom at points on leaves 46 proximate frame 42, where the leaves will eventually be severed from the frame. During final assembly of the chip packaging, frame 42 is discarded from the remainder of the general ensemble illustrated in FIG. 3. Circular regions 34, shown dotted, represent, in this particular case, the locations of copper spheres that are brought to bear on the foil surface and by which electrical communication is had through the dielectric lid (not shown) that eventually covers the packaged chip. When frame 42 has been discarded, leaves 46 are retroflexed over the border of the contact zone island from which they extend. In FIG. 3, the leaf 46 appearing in the upper left hand quadrant, for example, would be retroflexed over the dashed outline 49. All leaves 46 are treated in this fashion and the technique is more clearly illustrated in FIGS. 4 and 5.

After the template is properly shaped, it is preferred that it be aligned over the top metallization of the chip, as shown in FIG. 3, and undergo thermocompression bonding at a temperature above 200° C. Typical bonding procedures are performed at a temperature of about 325° C. for one-half hour at a pressure of 1,000–6,000 psi, with a pressure of about 3,000 psi being normally preferred. This results in complete conversion of the gold film on the copper foil into the desired stable intermetallic $AuAl_2$ at the aluminum-foil interface. Thereafter, the previously discussed routine is followed and final assembly in accordance with FIGS. 4 and 5 is accomplished.

Figure 4:
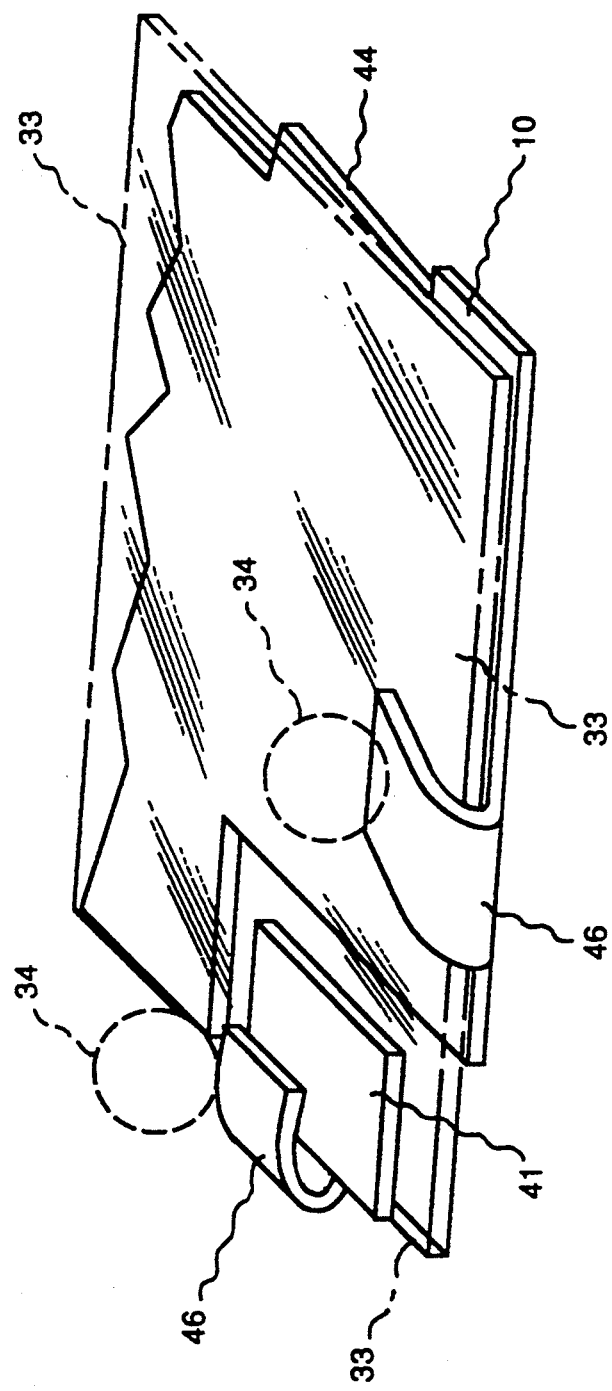
FIG. 4 is an isometric partial drawing of the foil overlay proximate the device gate.

FIG. 4 is an isometric illustration of the inventive foil 10 in its final assembly posture with a polyimide ply 33 overlaying the total island areas. The polyimide layer provides electrical isolation of foil 10 from the lid (except for the retroflexed leaves 46), and the retroflexed leaves, which will be pressed downward upon contact with metal spheres (shown dotted) or other suitable through-the-lid connectors, add a compliance factor. Here, leaves 46 are seen retroflexed over the main contact pad connector 44 and the gate contact pad connector 41.

Figure 5:
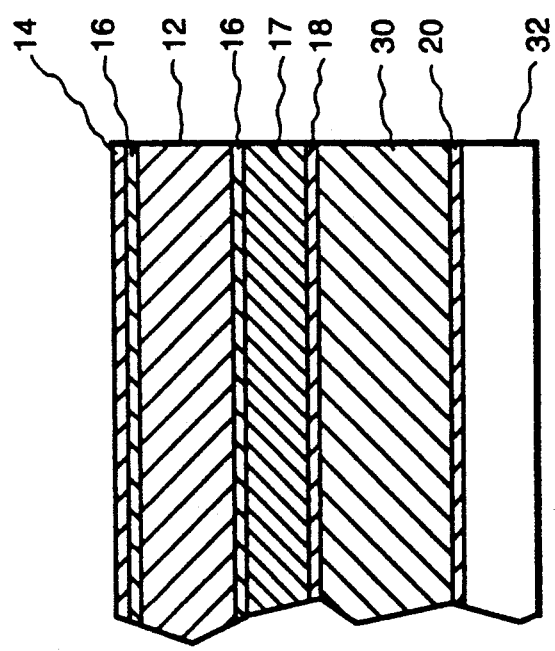
FIG. 5 is a sectional elevation of a portion of the FIG. 3 article looking in at arrows 5—5.

FIG. 5 serves to further clarify the structure shown in FIG. 4 by showing the elevational aspect of a section of the structure shown in FIG. 3 looking along arrows 5—5. As previously noted, aluminized padding 18 does not extend to the periphery of silicon chip 30, thus establishing guard ring region 38. The purpose of guard ring region 38 is to avoid short circuits caused by contact with neighboring chips as a result of large scale or batch formation processes. Such factor, however, as related to batch formation processes, is a subject not properly within the ambit of this disclosure.

What is claimed is:

1. A method for providing substantially inductance-free connection to selected surfaces of a semiconductor chip that bears thereon metal contact padding having a thickness, comprising preparing a foil laminate by coating a conductive foil with at least one metallic conductor capable of forming an intermetallic bond with the chip metal contact padding, and thermocompressively bonding said laminate to the padding by placing the metallic conductor coating in registry with the padding under pressure and at a temperature sufficient to induce a stable intermetallization bond between said metallic conductor and and padding so as to form an intermetallic layer therebetween.

2. The method of claim 1 wherein preparing the foil laminate includes providing a conductive metal boundary coating between said conductive foil and said metallic conductor so that padding metal in said intermetallization bond is separated from said foil.

3. The method of claim 1 wherein preparing the foil laminate comprises selecting a thickness of said metallic conductor coating to assure its exhaustion during said bonding and so as to leave an excess of padding metal between the chip and said intermetallic layer.

4. The method of claim 3 wherein the thermocompressive bonding is performed at temperatures above 200° C.

5. The method of claim 4 wherein the thermocompressive bonding is performed at a pressure in the range of 1,000–6,000 psi.

6. The method of claim 3 wherein the thermocompressive bonding is performed at a temperature of about 325° C. and a pressure of about 3,000 psi.

7. The method of claim 1 further comprising the step of cutting said foil into a desired network so as to overlay preselected chip areas and provide a foil template comprised of one or more pad contacting zones and at least one conductive leaf, respectively, extending from each of said pad contacting zones, respectively.

* * * * *